(12) United States Patent
Eva et al.

(10) Patent No.: US 7,907,347 B2
(45) Date of Patent: Mar. 15, 2011

(54) OPTICAL COMPOSITE MATERIAL AND METHOD FOR ITS PRODUCTION

(75) Inventors: Eric Eva, Aalen (DE); Wilfried Clauss, Tuebingen (DE)

(73) Assignee: Carl Zeiss SMT AG, Oberkochen (DE)

( * ) Notice: Subject to any disclaimer, the term of this patent is extended or adjusted under 35 U.S.C. 154(b) by 208 days.

(21) Appl. No.: 11/816,981

(22) PCT Filed: Feb. 22, 2006

(86) PCT No.: PCT/EP2006/001621
§ 371 (c)(1),
(2), (4) Date: Oct. 6, 2008

(87) PCT Pub. No.: WO2006/089738
PCT Pub. Date: Aug. 31, 2006

(65) Prior Publication Data
US 2009/0036289 A1 Feb. 5, 2009

Related U.S. Application Data

(60) Provisional application No. 60/655,718, filed on Feb. 23, 2005.

(51) Int. Cl.
*G02B 3/00* (2006.01)
*G02B 21/02* (2006.01)
*C03C 1/00* (2006.01)
*C03C 14/00* (2006.01)
*C03C 10/14* (2006.01)
*B32B 17/06* (2006.01)
*B32B 15/00* (2006.01)

(52) U.S. Cl. ............... 359/649; 359/656; 501/32; 501/4; 428/426; 428/432

(58) Field of Classification Search .............. 501/4, 5, 501/6, 7, 8, 9, 10, 32; 428/426, 432; 359/649, 359/656; 378/34; 353/39
See application file for complete search history.

(56) References Cited

U.S. PATENT DOCUMENTS

| | | | | |
|---|---|---|---|---|
| 5,476,821 A | * | 12/1995 | Beall et al. ........... | 501/10 |
| 5,968,857 A | * | 10/1999 | Pinckney ............. | 501/10 |
| 6,335,083 B1 | * | 1/2002 | Kasai et al. ........... | 428/143 |
| 7,031,428 B2 | * | 4/2006 | Dinger et al. .......... | 378/34 |

FOREIGN PATENT DOCUMENTS

| | | |
|---|---|---|
| DE | 103 22 444 A1 | 10/2003 |
| JP | 02030647 A | 1/1990 |
| WO | WO 03/059834 A1 | 7/2003 |
| WO | WO 03/091174 A1 | 11/2003 |
| WO | WO 03/100926 A1 | 12/2003 |

OTHER PUBLICATIONS

Svrcek et al. Ex situ perpared Si nanocrystals embedded in silica glass: Formation and characterization. Journal of Applied Physics, vol. 95, No. 6. Mar. 15, 2004.*
Nobuyuki Kambe et al., "Refractive Index Engineering of Nano-Polymer Composites", Proceedings vol. 676, p. 1-6, 2002.

* cited by examiner

*Primary Examiner* — Karl E Group
*Assistant Examiner* — Noah S Wiese
(74) *Attorney, Agent, or Firm* — Sughrue Mion, PLLC

(57) ABSTRACT

An optical composite material comprises an amorphous optical material (6) with a first refractive index ($n_a$), into which crystalline nanoparticles (7) having a second, higher refractive index ($n_n$) are embedded, wherein the amorphous material (6) and the nanoparticles (7) are resistant to UV radiation. A microlithography projection exposure apparatus comprises a projection objective (2) with at least one optical element (3) which is, in particular, operated in transmission and consists of an optical composite material of this type. In a method for producing the optical composite material, crystalline nanoparticles are introduced into the amorphous optical material during flame deposition in a soot or direct process.

24 Claims, 1 Drawing Sheet

OPTICAL COMPOSITE MATERIAL AND METHOD FOR ITS PRODUCTION

CROSS-REFERENCE TO RELATED APPLICATIONS

This application claims the benefit under 35 U.S.C. 119(e)(1) of U.S. Provisional Application No. 60/655,718, filed Feb. 23, 2005. The disclosure of U.S. Provisional Application No. 60/655,718 filed Feb. 23, 2005 is considered part of and is incorporated by reference in the disclosure of this application.

BACKGROUND OF THE INVENTION

This invention relates to an optical composite material and a method for its production.

The requirements for optical materials which are used in microlithography projection exposure apparatuses are generally very high. These materials must on the one hand withstand high laser intensity in the UV or VUV wavelength range and on the other hand also have a sufficiently large transmission in this wavelength range.

In immersion systems, the requirements for the optical terminating element, which is in contact with the immersion liquid, are particularly high, since it should have a maximum refractive index for generating a large numerical aperture on the one hand and on the other hand withstand the relatively high energy density in the region close to the wafer.

The terminating element usually consists either of crystalline materials (e.g. $CaF_2$) or amorphous materials such as e.g. quartz glass (fused silica). The advantage of crystalline materials is that they have a high radiation resistance, but their production with the required purity and optical quality requires great expense. The selection of suitable materials is moreover limited by the predetermined material properties of the crystals. In particular, there are only very few crystalline materials which meet both the requirements for high UV transmission and increased refraction index at the same time. On the other hand, quartz glass (fused silica) has already a relatively high refractive index but, since it is an amorphous material, it is not as stable as highly-regular crystalline materials. Moreover, systems with a numerical aperture of more than 1.4 require a material having a higher refractive index than quartz glass (1.56), since this refractive index should be adjusted to the high refractive index of the immersion liquid.

OBJECT OF THE INVENTION

It is an object of the invention to provide an optical composite material for UV and VUV radiation which combines the advantages of amorphous materials with the advantages of crystalline materials for generating a high refractive index, and also a production method for an optical composite material of this type.

SUMMARY OF THE INVENTION

In accordance with the invention, an optical composite material is provided which comprises an amorphous optical material having a first refractive index, into which crystalline nanoparticles having a second, higher refractive index are embedded, wherein the amorphous material and the nanoparticles are resistant to UV radiation.

The invention proposes the production of a lens material, in particular, for VUV microlithography from a novel composite material which consists of a mixture of "conventional" amorphous, optical material and nanoparticles of highly refractive materials. The amorphous material thereby has the function to enclose the highly refractive particles in an optically homogeneous manner, and to minimize the index jump on the surface of the particles. Nanocrystal doping serves to shift the refractive index of the entire composite material to maximum values.

The general function of this mixing principle was already shown using a system of PAA (poly acrylic acid) as amorphous material which was chemically bound to $TiO_2$ as crystalline material, for the wavelength range of visible light. With this system, the refractive index of PAA could be increased from 1.5 to approximately 2.4 by adding up to 50% nanoparticles, see "Refractive Index Engineering of Nano-Polymer Composites", N Kambe et al., MRS conference, San Francisco, April 2001, see web address:
http://www.nanogram.com/information/papers.htm In one embodiment, the crystalline nanoparticles have a cubical crystal structure and consist, in particular, of yttrium aluminium garnet (YAG, $Y_3Al_5O_{12}$), spinel ($MgAl_2O_4$), lutetium aluminium garnet (LuAG, $Lu_3Al_5O_{12}$) and/or MgO. These materials are particularly easy to process, have a high refractive index and are available in the form of nanoparticles. It is also possible to introduce nanoparticles of $Y_3Al_5O_{12}$ together with nanoparticles of $MgAl_2O_4$ or MgO into the composite material.

In one preferred embodiment, the average diameter of the nanoparticles is selected to minimize the UV radiation absorbed by the nanoparticles. To this end, the nanoparticles must be chosen large enough to prevent quantum-mechanical finite-size effects within the nanoparticles, which could produce undesired optical or electronic excitations. Such effects are known especially from investigations of metallic and oxidic clusters with typical orders of magnitude of a few nanometers (up to a few hundred atoms/cluster).

In a further embodiment, the average diameter of the nanoparticles is selected to minimize the UV radiation scattered on the nanoparticles. The optical scattering effects occurring in the composite material are described, depending on the particle size, by the theory of the Mie or Rayleigh scattering (for the borderline case of a particle size<<$\lambda$ typically 10 nm or smaller). To minimize the scattering intensity, the particles must be as small as possible, in this borderline case (Rayleigh), the intensity is ~$\lambda^{-4}$.

The average diameter of the nanoparticles must therefore on the one hand be large enough to prevent finite-size effects, and on the other hand be small enough to prevent excessive increase in the scattering intensity. This condition is very well met for average diameters of between 50 nm and 70 nm.

In a further preferred embodiment, the nanoparticles are homogeneously distributed in the amorphous material. The order of magnitude used for the nanoparticles permits adjusting the spatial distribution of the nanoparticles as homogeneously and ordered as possible through suitable production methods of the composite material. Since the scattering intensity depends, in addition to the particle size, also on the disorder of particle distribution, the expected scattering intensity will be smaller with higher homogeneity, thereby minimizing the Rayleigh scattering.

In one embodiment, the variance of the diameter distribution of the nanoparticles is as small as possible. In particular, the diameter distribution should contain no nanoparticles having a diameter of more than two times, in particular, 1.5 times the average diameter, since nanoparticles of this size have a negative effect on the scattering intensity.

In a further advantageous embodiment, the nanoparticles have a minimum diameter of 5 nm and a maximum diameter of 80 nm. In this case, the diameter distribution is small enough to ensure sufficient optical homogeneity.

In a particularly preferred embodiment, the nanoparticles have a refractive index of more than 1.8. Amorphous materials used in microlithography usually have a refractive index of typically approximately 1.5. Adding nanoparticles having a refractive index of more than 1.8 consequently increases the refractive index of the composite material. In the following, the refractive index is given for a wavelength of $\lambda=193$ nm.

In a further advantageous embodiment, the amorphous material has a refractive index of more than 1.5. With the use of an amorphous material that already has a high refractive index itself, it is possible to achieve a desired high refractive index by adding a small portion of nanoparticles.

In a further preferred embodiment, the amorphous material is quartz glass or a UV resistant polymer. Quartz glass (e.g. fused silica) is particularly preferred as amorphous material, since it is chemically inert to most immersion fluids which can be considered for this purpose. An organic or silicon-based polymer is preferably used.

In a further preferred embodiment, the optical composite material has an optical homogeneity of less than 0.1 ppm. The optical homogeneity is determined by the maximum refractive index fluctuation in an optical material. The optical homogeneity in microlithography must meet the highest demands.

A further aspect of the invention is implemented in an optical element which is operated, in particular, in transmission, consisting of the above-described composite material, and a projection objective for UV microlithography with an optical element of this type and an associated microlithography projection exposure apparatus. An inventive optical element consists of the inventive composite material having a high laser resistance and at the same time a high refractive index. It is therefore particularly advantageous to produce an optical terminating element (i.e. an optical element which is arranged closest to the wafer) of a projection objective for immersion from such a composite material, since such an element must meet particularly high requirements as regards laser resistance and refractive index.

Another aspect of the invention is implemented in a production method for the above-described optical composite material, wherein crystalline nanoparticles are introduced into the amorphous optical material during flame deposition in a soot or direct process. The nanoparticles having a high refractive index are produced to have a particle size distribution which is as narrow as possible. The inventors have realized that it is particularly advantageous to introduce the nanoparticles into the amorphous material during flame deposition. The flame deposition process may thereby be a soot process forming a preform which is sintered in a subsequent process step to produce the composite material. This process may alternatively also be a direct deposition process, wherein the composite material is obtained directly from flame deposition. When quartz glass is used as amorphous optical material, the conventional fused-silica production methods may be used.

In an advantageous variant, the nanoparticles are introduced into at least one of the gas flows which are supplied to the deposition flame. During soot deposition, the nanoparticles are introduced into one of the gas flows (e.g. Si precursor, $H_2$, $O_2$, possibly heating gas, e.g. natural gas). The particles are thereby swept along, integrated into the powdery raw glass body (preform) and are subsequently formed to glass therewith in a sintering process. This procedure is, in principle, also feasible for direct deposition, but the nanoparticles would normally melt due to the flame temperatures of more than 1800° C. If a liquid, usually organic, Si precursor is used that must be dispersed, it is also possible to add the particles to the liquid.

In a preferred variant, the nanoparticles are introduced into an outer flow of air or inert gas that surrounds the deposition flame. This method is suited both for soot and direct deposition.

In the soot process, the nanoparticles are introduced into the powder in a homogeneously distributed form and are sintered therewith to form a glass body. In the direct process, deposition in layers is also possible by moving the deposition flame and the glass surface relative to each other, e.g. by pivoting the flame and/or rotating the blank. This also yields a fine distribution of the nanoparticles.

In a further preferred variant, the flame deposition is effected in layers and the nanoparticles are spread or blown onto newly deposited surface layers at a distance from the deposition flame. Damage to the nanoparticles due to the high flame temperature can be prevented by simultaneous mechanical spreading or blowing-on of finely dispersed nanoparticles at a spatial distance from the separating flame in a soot or direct process. The nanoparticles thereby adhere to the newly deposited surfaces. Mechanical spreading generally works only when the newly deposited surface faces upwards, i.e. for example in case of direct deposition in a vertical method.

An additional aspect relates to a method for producing the above-described composite material, wherein a preform of amorphous material is crushed, the crushed preform is mixed with nanoparticles, a compact body, also called a cake, is produced from the mixture and the cake is subsequently sintered. The preform is produced in a soot process, wherein it is possible to introduce nanoparticles into the preform already in the soot process according to the above-described method. The porous powder body produced in the soot process is ground and mechanically mixed with finely dispersed nanoparticles. The mixture is formed to a new powder body through introduction into a mold or compression, and is subsequently sintered to a glass body in a final sintering step.

In a particularly preferred variant, the optical composite material is completely or locally heated and mechanically kneaded, thereby achieving homogeneous distribution of the nanoparticles.

In a particularly preferred modification of this variant, additional nanoparticles are spread or blown into the optical composite material with the effect that the nanoparticles are homogenized and simultaneously concentrated in the amorphous material. It is also possible to introduce the nanoparticles into the amorphous material only during the homogenization step.

Further features and advantages can be extracted from the following description of an exemplary embodiment, from the figures of the drawing, which show significant details, and are defined by the claims. The individual features can be realized either individually or collectively in arbitrary combination.

BRIEF DESCRIPTION OF THE DRAWINGS

The schematic drawing shows an exemplary embodiment which is explained in the following description.

DETAILED DESCRIPTION OF PREFERRED EMBODIMENTS

Figure 1:
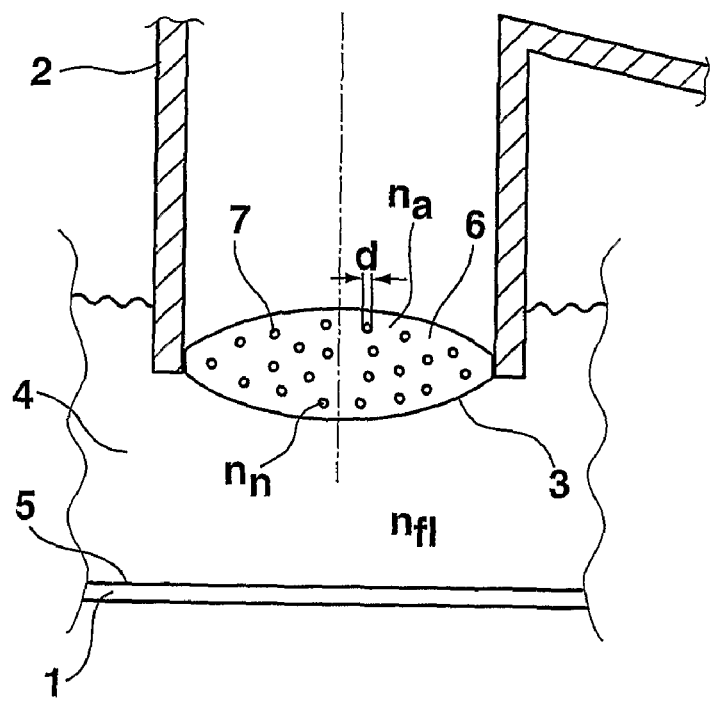
FIG. 1 shows a detail of a projection objective for immersion having an optical terminating element which consists of the inventive optical composite material.

FIG. 1 shows a portion of a catadioptric projection objective 2 for microlithography facing a wafer 1 which is part of a microlithography projection exposure apparatus (not shown). A transparent optical element 3 which is operated in transmission forms the termination of the projection objective 2 and is immersed with its wafer-side surface into an immersion liquid 4, e.g. water, deuterated water, a cyclic hydrocarbon compound or a perfluorinated ether compound. The immersion liquid 4 serves to generate a high numerical aperture (NA>1.4) on the wafer side during exposure of a light-sensitive substrate 5 of the wafer 1. For this purpose, the immersion liquid 4 has a refractive index nfl=1.7 which is considerably larger than that of air ($n_L$=1). The high numerical aperture increases the resolution of the image with the result that when a laser source of a wavelength λ of 193 nm is used, it is possible to image structures of considerably smaller line widths on the wafer 1 compared to a non-immersion system (dry system).

The minimum resolved line width W is given by the Rayleigh equation:

$$W = k_1 \lambda / NA.$$

($k_1$: process factor (>0.25); NA: numerical aperture; λ: imaging wavelength)

The larger the numerical aperture NA, the smaller the minimum line width W that can be resolved. The numerical aperture NA is proportional to the refractive index of the immersion liquid nfl. The refractive index of the optical element 3 should be adjusted as good as possible to the refractive index $n_{fl}$ of the immersion liquid. The optical element 3 therefore has a total refractive index $n_{tot}$ ($\approx n_{fl}$) of 1.7 in the present case.

The optical element 3 consists of a quartz glass body as amorphous material 6 (having a first refractive index $n_a$=1.55) into that 40% crystalline nanoparticles 7 of spinel (MgAl$_2$O$_4$) (with a second refractive index $n_n \approx 1.8$) were introduced. The total refractive index $n_{tot}$ of 1.7 is above the first refractive index $n_a$ of the amorphous material 6. The total refractive index $n_{tot}$ of the optical element 3 can be adjusted within a wide interval above the refractive index $n_a$ of the amorphous material 6 in dependence on the percentage and the type of nanoparticles. It is necessary to use nanoparticles 7 to increase the total refractive index $n_{tot}$, since introduction of larger, highly refractive particles, in particular, those having a diameter larger than the wavelength of the used light, would heavily disturb the optical homogeneity of the optical element 3. Quartz glass is particularly suited as amorphous material 6 since it does not react with the immersion liquid 4.

The nanoparticles 7 have an average diameter d of 50 nm with a diameter distribution, wherein an extremely small number of nanoparticles 7 are larger than 1.5 times the average diameter d. The average diameter d is selected large enough to prevent finite-size effects which cause excessive absorption of radiation in the nanoparticles 7, and on the other hand small enough to limit the increased generation of scattered light. The occurrence of scattered light is also effectively prevented in that the nanoparticles 7 are homogeneously distributed in the optical element 3. This requires a production method that permits homogeneous distribution of the nanoparticles 7 in the amorphous material 6.

Figure 2:
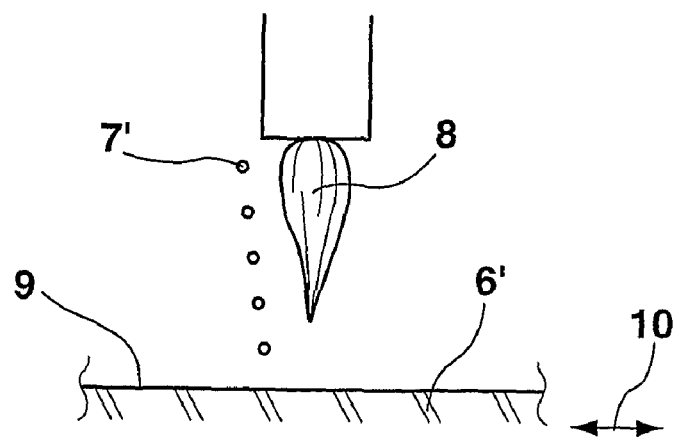
FIG. 2 shows a schematic view of an inventive flame deposition process for producing the inventive optical composite material.

In FIG. 2, such a method is represented graphically. A flame 8 serves for direct deposition of evaporated quartz material provided in the flame 8 onto a surface 9 of a blank of amorphous material 6' (quartz glass). Flame deposition is effected in layers, wherein the flame 8 is moved relative to the surface 9 of the amorphous material 6' as indicated by a double-headed arrow 10. Nanoparticles 7' are thereby mechanically spread onto newly deposited surface layers at a distance from the flame 8. In the direct deposition process, the nanoparticles 7' must be deposited at a spatial distance due to the high flame temperatures of more than 1800° C. to prevent melting of the nanoparticles 7'.

In an alternative variant related to a soot process, due to the lower flame temperature, the nanoparticles can be directly introduced into the gas flows which are supplied to the deposition flame. In a further variant, the nanoparticles can alternatively or additionally be introduced into an outer flow of air or inert gas surrounding the deposition flame.

Alternatively or additionally, it is also possible to initially produce a preform of amorphous material in a soot process, to crush it into particles which are then homogeneously mixed with nanoparticles, and to produce a cake from said mixture to obtain an optical composite material through sintering of the cake.

In one variant, the production method includes a homogenization step, wherein the optical composite material is completely or locally heated and mechanically kneaded. It is thereby possible to spread or blow additional nanoparticles into the optical composite material, however, it is also possible to supply the nanoparticles only in the homogenization step.

The optical composite material described herein is particularly suited for producing optical elements which have a high transmission in the UV range, are exposed to high radiation doses and have a high refractive index, i.e. in particular, but not exclusively for producing optical elements such as the terminating element of the projection objective 2 shown in FIG. 1.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A projection objective for a microlithography projection exposure apparatus for imaging a structure on a light-sensitive substrate, comprising an optical element;
   wherein the optical element consists of an optical composite material,
   wherein the optical composite material comprises an amorphous optical material with a first refractive index, into which crystalline nanoparticles having a second, higher refractive index are embedded, and
   wherein the amorphous material and the nanoparticles are resistant to UV radiation.

2. The projection objective according to claim 1, wherein the nanoparticles have a cubic crystal structure.

3. The projection objective according to claim 1, wherein the nanoparticles are selected from a group of materials consisting of: Y$_3$Al$_5$O$_{12}$, MgAl$_2$O$_4$, Lu$_3$Al$_5$O$_{12}$, and MgO.

4. The projection objective according to claim 1, wherein an average diameter of the nanoparticles is selected to minimize UV radiation absorbed by the nanoparticles.

5. The projection objective according to claim 1, wherein an average diameter of the nanoparticles is selected to minimize UV radiation scattered on the nanoparticles.

6. The projection objective according to claim 1, wherein an average diameter of the nanoparticles is between 50 nm and 70 nm.

7. The projection objective according to claim 1, wherein the nanoparticles are homogeneously distributed in the amorphous material.

8. The projection objective according to claim 1, wherein a variance of a diameter distribution of the nanoparticles is less than or equal to 1.5 times an average diameter of the nanoparticles.

9. The projection objective according to claim 1, wherein the nanoparticles have a minimum diameter of 5 nm and a maximum diameter of 80 nm.

10. The projection objective according to claim 1, wherein the second refractive index is larger than 1.8.

11. The projection objective according to claim 1, wherein the first refractive index is larger than 1.5.

12. The projection objective according to claim 1, wherein the amorphous material is quartz glass or a UV resistant polymer.

13. The projection objective according to claim 1, wherein the optical composite material has an optical homogeneity of less than 0.1 ppm.

14. The projection objective according to claim 1, wherein the optical element operates in transmission.

15. Microlithography projection exposure apparatus comprising a projection objective according to claim 1, wherein an immersion liquid is disposed between the optical element and a light-sensitive substrate.

16. A projection objective for a microlithography projection exposure apparatus for imaging a structure on a light-sensitive substrate, comprising an optical element;
wherein the optical element comprises an optical composite material,
wherein the optical composite material comprises an amorphous optical material with a first refractive index, into which crystalline nanoparticles having a second, higher refractive index are embedded, and
wherein the amorphous material and the nanoparticles are resistant to UV radiation.

17. A method for producing the projection objective according to claim 1, wherein crystalline nanoparticles are introduced into the amorphous optical material during flame deposition in a soot or direct process.

18. The method according to claim 17, wherein the nanoparticles are introduced into a gas flow which is supplied to the deposition flame.

19. The method according to claim 17, wherein nanoparticles are introduced into an outer flow of air or inert gas surrounding the deposition flame.

20. The method according to claim 17, wherein the flame deposition is performed in layers and the nanoparticles are spread or blown onto newly deposited surface layers at a distance from the deposition flame.

21. A method for producing the projection objective according to claim 1, comprising the following steps: crushing of a perform of amorphous material, mixing the crushed perform with nanoparticles, producing a cake from the mixture, and sintering of the cake.

22. The method according to claim 21, wherein the optical composite material is completely or locally heated and mechanically kneaded.

23. The method according to claim 21, wherein additional nanoparticles are spread or blown into the optical composition material.

24. The method according to claim 17, wherein the optical composite material is completely or locally heated and mechanically kneaded.

* * * * *

UNITED STATES PATENT AND TRADEMARK OFFICE
CERTIFICATE OF CORRECTION

PATENT NO. : 7,907,347 B2
APPLICATION NO. : 11/816981
DATED : March 15, 2011
INVENTOR(S) : Eric Eva and Wilfried Clauss It is certified that error appears in the above-identified patent and that said Letters Patent is hereby corrected as shown below:

Cover Page under "OTHER PUBLICATIONS", line 1: delete "perpared" and insert -- prepared -- therefor Column 5, line 15: delete "nfl" and insert -- $n_{fl}$ -- therefor Column 5, line 31: delete "nfl." and insert -- $n_{fl}$. -- therefor Column 8, line 22 (approx): In Claim 21, line 3, delete "perform" and insert -- preform -- therefor Column 8, line 23 (approx): In Claim 21, line 4, delete "perform" and insert -- preform -- therefor.

Signed and Sealed this
Twentieth Day of November, 2012

David J. Kappos
*Director of the United States Patent and Trademark Office*